US005130392A

United States Patent [19]

Schwalm et al.

[11] Patent Number: 5,130,392

[45] Date of Patent: Jul. 14, 1992

[54] RADIATION-SENSITIVE POLYMERS

[75] Inventors: Reinhold Schwalm, Wachenheim; Andreas Boettcher, Nussloch, both of Fed. Rep. of Germany

[73] Assignee: BASF Aktiengesellschaft, Ludwigshafen, Fed Rep. of Germany

[21] Appl. No.: 462,716

[22] Filed: Jan. 9, 1990

[30] Foreign Application Priority Data

Jan. 25, 1989 [DE] Fed. Rep. of Germany ....... 3902115

[51] Int. Cl.$^5$ ........................ G03C 1/492; C08F 28/02

[52] U.S. Cl. .................................... 526/288; 430/170; 430/270; 430/322; 430/325; 522/178; 522/180; 522/182; 522/183; 522/184; 526/239; 526/240; 526/256; 526/286; 526/291; 526/292.3; 526/293

[58] Field of Search ............... 430/270, 170, 322, 325; 526/288, 240

[56] References Cited

U.S. PATENT DOCUMENTS

| | | | |
|---|---|---|---|
| 4,069,056 | 1/1978 | Crivello | 522/25 |
| 4,150,988 | 4/1979 | Crivello | 522/31 |
| 4,175,972 | 11/1979 | Crivello | 522/25 |
| 4,175,973 | 11/1979 | Crivello | 522/25 |
| 4,491,628 | 1/1985 | Ito | 430/176 |
| 4,537,854 | 8/1985 | Crivello | 430/283 |
| 4,603,101 | 7/1986 | Crivello | 430/270 |
| 4,610,952 | 9/1986 | Crivello | 430/325 |
| 4,689,289 | 8/1987 | Crivello | 430/27 |
| 4,780,511 | 10/1988 | Crivello | 525/353 |
| 4,816,383 | 3/1989 | Taguchi et al. | 430/322 |
| 4,840,977 | 6/1989 | Crivello | 522/25 |

OTHER PUBLICATIONS

J. Polym. Sci., Part C: Polymer Letters, vol. 26, 77-81 (1988).

*Primary Examiner*—Joseph L. Schofer
*Assistant Examiner*—Fred Zitomer
*Attorney, Agent, or Firm*—Keil & Weinkauf

[57] ABSTRACT

Radiation-sensitive polymers suitable for use in positive- and negative-working recording elements contain not only acid-labile groups but also onium salt groups having nonnucleophilic counterions in one and the same molecule.

9 Claims, No Drawings

RADIATION-SENSITIVE POLYMERS

The present invention relates to novel radiation-sensitive polymers which contain acid-labile groups and onium salt groups. The polarity of these polymers is strongly changed by the action of light and subsequent thermal treatment, so that they are suitable for use as photoresists.

Radiation-sensitive polymers are known. For instance, poly(alkyl methacrylates) are used as photoresists, since on irradiation they undergo molecular weight degradation and consequently have a higher solubility in the irradiated areas than in the high molecular weight non-irradiated areas.

A further class of radiation-sensitive polymers are poly(olefin sulfones), which on irradiation likewise degrade and release sulfur dioxide and olefin.

Radiation-sensitive polymers which contain sulfonium salt units in the polymer are likewise known (cf. H. Tagoshi and T. Endo, J. Polym. Sci., Part C: Polym. Lett. 26 (1988), 77-81); but these polymers do not contain any acid-labile groups, but contain spiro orthoesters which crosslink on irradiation.

The prior art on resists includes mixtures of polymers having acid-labile groups and onium salts as photoactive component (cf. U.S. Pat. No. 4,491,628 and DE-A-3,620,677) which on irradiation undergo large changes in polarity. For instance, the hydrophobic t-butyl carbonates or ethers of phenolic polymers produce alkali-soluble phenolic polymers on irradiation. However, if these polymers are used to produce resist profiles, these mixtures are found to have a large disadvantage: instead of producing the desired rectangular resist profiles they produce bridge-like structures. This effect is probably due to the inhomogeneous distribution of the sulfonium salts in the resist layer and can only be corrected by expensive measures.

It is an object of the present invention to provide photoresist materials which produce an improved structural profile without having an adverse effect on the good properties of prior art mixtures.

We have found, surprisingly, that this object is achieved by radiation-sensitive polymers which contain acid-labile groups and onium salt groups with nonnucleophilic counterions in one and the same molecule.

The present invention accordingly provides radiation-sensitive polymers which contain in one and the same molecule not only acid-labile groups but also onium salt groups with nonnucleophilic counterions, the preferred onium salt groups being sulfonium and iodonium salt groups.

The radiation-sensitive polymers according to the present invention contain in particular, copolymerized in one and the same molecule, units of the general formulae (I) and (II) or (I) and (III)

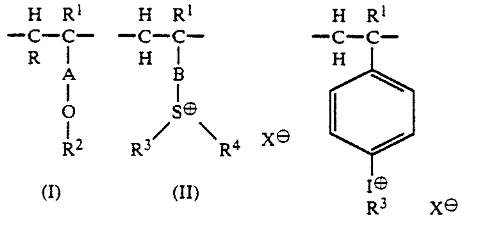

(I) (II) (III)

-continued where A =

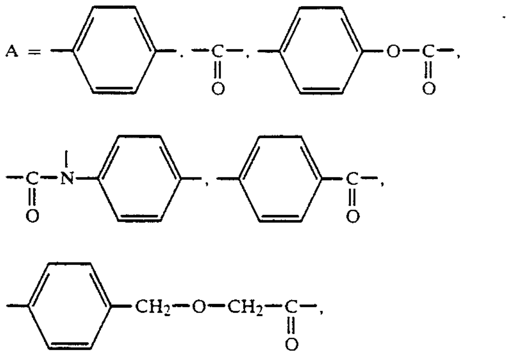

B is a divalent radical, such as alkylene,

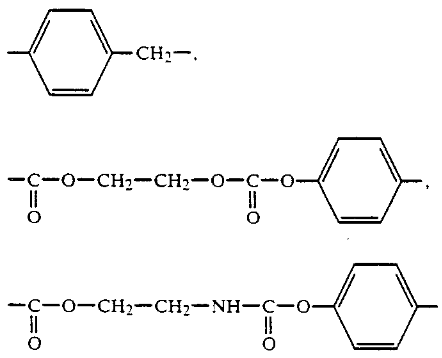

or phenylene,

R is H, alkyl, aryl substituted aryl or if

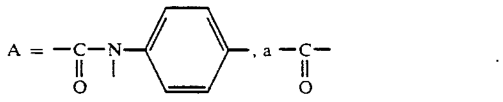

group bonded to this group A at the nitrogen atom, $R^1$ is H, alkyl, CN, halogen or trihalomethyl, $R^2$ is an acid-labile group, $R^3$ and $R^4$, which may be identical to or different from each other, are each alkyl, aryl or substituted aryl or together form a 5-, 6-, 7-, 8- or 9-membered ring, $X^{\ominus}$ is a nonnucleophilic counterion selected from the group consisting of $ClO_4^{\ominus}$, $CF_3SO_3^{\ominus}$, $BF_4^{\ominus}$, $AsF_6^{\ominus}$, $SbF_6^{\ominus}$ and $PF_6^{\ominus}$.

The radiation-sensitive polymers according to the present invention preferably contain as copolymerized units from 2 to 30 mol % of monomer units having sulfonium or iodonium salt groups.

The present invention also provides a positive-working recording element where the irradiated areas are removed with an alkaline or polar solvent, and also a negative-working recording element where the nonirradiated areas are removed with an apolar organic solvent, each recording element being based on the use of radiation-sensitive polymers according to the present invention.

The radiation-sensitive polymers according to the present invention are highly suitable for use as photoresists and produce the desired resist profiles without additional measures or process steps. They are therefore very advantageously suitable for fabricating semiconductor components.

The radiation-sensitive polymers according to the present invention can be irradiated with shortwave UV light, with longwave UV light (following appropriate sensitization), with electron beams and with X-rays, and depending on the choice of developer produce positive or negative resist patterns.

There now follow detailed observations concerning the formative components of the polymers according to the present invention.

The radiation-sensitive polymers according to the present invention preferably contain—as copolymerized units in one and the same molecule—units of the general formulae (I) and (II) or (I) and (III)

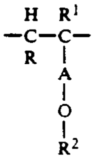
(I)

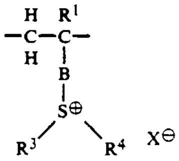
(II)

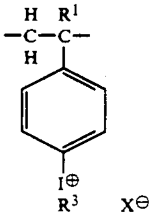
(III)

where

A can be for example one of the following bivalent radicals:

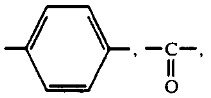

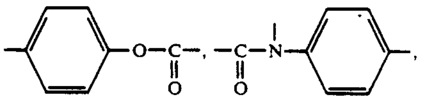

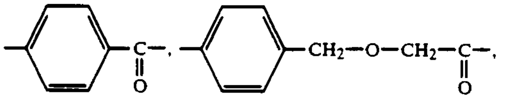

B is a bivalent spacer radical, such as alkylene of from 1 to 10 carbon atoms,

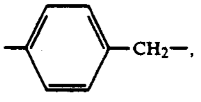

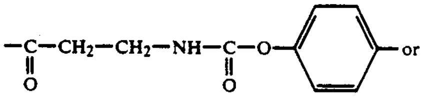

phenylene,

R is H, alkyl, for example of from 1 to 6 carbon atoms, e.g. methyl or ethyl, aryl, e.g. phenyl, substituted aryl, e.g. alkyl- or halogen-substituted phenyl, or if

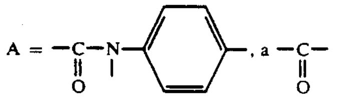

group bonded to this group A at the nitrogen atom (i.e. forming part of a five-membered maleimide ring), $R^1$ is H, alkyl, for example of from 1 to 6 carbon atoms, such as methyl or ethyl, CN, halogen, e.g. chlorine or fluorine, or trihalomethyl, e.g. trifluoromethyl, $R^2$ is an acid-labile group, e.g. t-alkyl, t-alkoxycarbonyl, trialkylsilyl, tetrahydropyranyl or α,α-dialkylbenzyl, $R^3$ and $R^4$, which may be identical to or different from each other, are each alkyl, for example of from 1 to 6 carbon atoms, e.g. methyl or ethyl, aryl, e.g. phenyl, substituted aryl, for example alkylphenyl, halophenyl or methoxyphenyl, or together may form a 5-, 6-, 7-, 8- or 9-membered ring, for example a tetrahydrothiophene ring, and $X^{\ominus}$ is a nonnucleophilic counterion, e.g. $ClO_4^{\ominus}$, $CF_3SO_3^{\ominus}$, $BF_4^{\ominus}$, $AsF_6^{\ominus}$, $SbF_6^{\ominus}$ or $PF_6^{\ominus}$.

Preference according to the present invention is given to copolymers of monomers which contain acid-labile groups and also monomers which contain sulfonium salt groups.

Examples of monomers having acid-labile groups (I) are appropriately substituted styrenes, substituted esters of acrylic or methacrylic acid and substituted maleimides, for example of the following structures:

Ia)

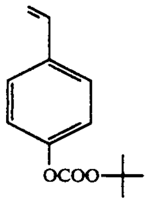

Ib)

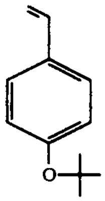

Ic)

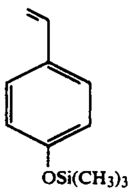

Id)

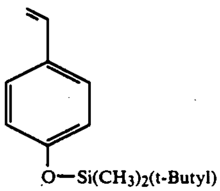

-continued
Ie)
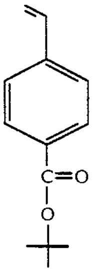
If)
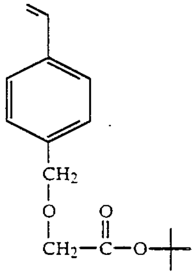
Ig)
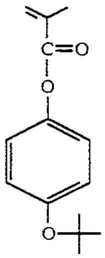
Ih)
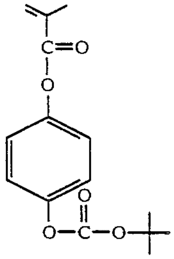
Ii)
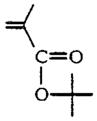
Ij)
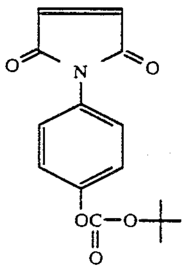
-continued
Ik)
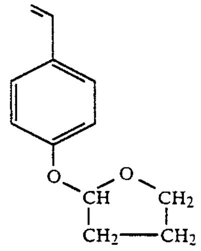
Il)
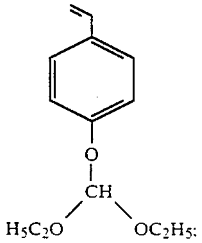
Examples of monomers having sulfonium groups are:
IIa)
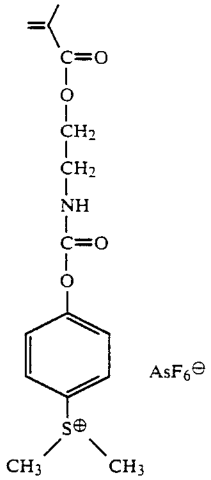
IIb)
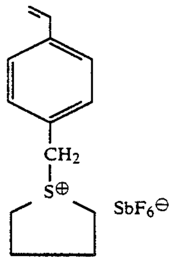

-continued

IIc)

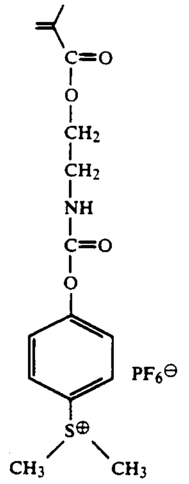

IId)

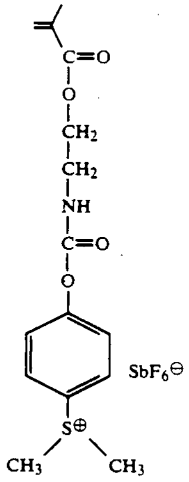

IIe)

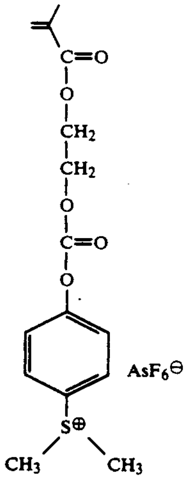

Although these monomers are preferred, it is possible to use any of the monomers used in copending German Patent Application P . . . (O.Z. 0050/40519), which claims and describes radiation-sensitive, ethylenically unsaturated, copolymerizable sulfonium salts of the general formula $$[(R)_a(R^1)_b(R^2)_cS^{\oplus}]A^{\ominus} \quad (I)$$

and the preparation thereof. In this formula (I),

R is a substituted or unsubstituted monovalent aromatic organic radical, $R^1$ is a substituted or unsubstituted monovalent organic aliphatic radical from the group consisting of the alkyl, cycloalkyl and substituted alkyl radicals, $R^2$ is a substituted or unsubstituted divalent or trivalent aliphatic or aromatic organic radical which forms a heterocyclic or fused ring structure, a is an integer from 0 to 3 inclusive, b is an integer from 0 to 2 inclusive, c is 0 or 1, the sum a+b+c being 3, and $A^{\ominus}$ is the anion of an acid, and at least one of the radicals R to $R^2$ having attached to it one of the radicals

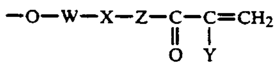

$—O—W—X—Z—CH{=}CH_2$ where

W is a single bond or one of the groups

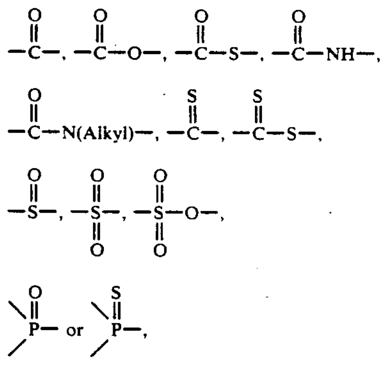

X is a divalent substituted or unsubstituted alkylene radical $—(CH_2)_m—$, a radical

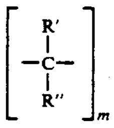

where m is from 1 to 10 and

R' and R'', which may be identical to or different from each other, are each aryl, $C_1$-$C_4$-alkyl, H, COOH, $COOCH_3$ or $COOC_2H_5$, a perfluorinated alkylene radical $—(CF_2)_m—$ where m is from 1 to 10, an oxaalkylene radical $—(CH_2)_n—O—(CH_2)_p—$ where n and p are each from 1 to 5, a perfluorinated oxaalkylene radical $—(CF_2)_n—O—(CF_2)_p—$ where n and p are each from 1 to 5, or an unfluorinated or perfluorinated polyoxaalkylene radical of from 2 to 20 carbon atoms bonded together via at least one $—CH_2—$, $—CF_2—$ or $—CH_2—CH(CH_3)—$ group, one of the radicals $—(CH_2)_m—O—CO—O—(CH_2)_n—$, $—(CH_2)_n—O—CO—NH—(CH_2)_m—$, $—(CH_2)_n—NH—CO—O—(CH_2)_m—$, $-(CH_2)_m-CO-O-(CH_2)_n-$ or $-(CH_2)_m-O-CO-(CH_2)_n-$ where m and n are each from 1 to 10, an unsubstituted or $C_1$-$C_4$alkyl—, OH—, $OCH_3$—, $OC_2H_5$—, SH—, $SCh_3$—, $SC_2H_5$—, Cl—, F—, $N(alkyl)_2$— or $N(CH_3)C_6H_5$-, o-, m- and/or p-substituted phenylene or a cycloalkylene radical of from 5 to 10 carbon atoms or a (bis)methylenecycloalkylene radical of from 6 to 12 carbon atoms, Y is H, alkyl of from 1 to 6 carbon atoms or phenyl, and Z is O or NY.

Particularly preferred copolymers are p-t-butoxcarbonyloxystyrene and comonomer IIa, p-t-butoxycarbonyloxystyrene and comonomer IIb, p-t-butoxystyrene and comonomer IIa, p-t-butoxystyrene and comonomer IIb, t-butyl p-vinylbenzoate and comonomer IIa, p-trimethylsilyloxystyrene and comonomer IIa, and p-trimethylsilyloxystyrene and comonomer IIb.

The level of copolymerized units of comonomers having sulfonium or iodonium salt groups (II) in the polymers according to the present invention is in general from 1 to 50, preferably from 2 to 30, in particular from 2 to 20, mol % of the polymer.

The polymers according to the present invention can be prepared by copolymerizing the comonomers (I) and (II) in a conventional manner, for example by free radical polymerization using azo initiators Although these copolymers are preferred, the acid-labile and sulfonium salt groups can also be introduced into the radiation-sensitive polymers in some other way, for example by polymer-analogous reaction or by polyaddition or polycondensation reactions.

Furthermore, the present invention is not restricted to the acid-labile groups mentioned; on the contrary, it is also possible to use a large number of other unknown acid-labile groups such as trityl, benzyl, acetals etc. as $R^2$.

The molecular weight of the polymers according to the present invention is in general from 5,000 to 200,000, preferably from 10,000 to 80,000 ($\bar{M}_w$: light scattering).

For further processing and use, the polymers according to the present invention are in general dissolved in a suitable solvent, e.g. ethylene glycol ethyl ether acetate, cyclohexanone or methylpropylene glycol acetate, the solution is applied to a substrate, for example a silicon wafer, as a thin film about 1-2 μm in thickness and heated under controlled conditions, for example at from 60° to 120° C., subjected to imagewise exposure and heated once more under controlled conditions at from 40° to 120° C.

Thereafter either the irradiated areas can be removed with an alkaline or polar solvent, or the non-irradiated areas can be removed with an apolar solvent.

The polymers according to the present invention are particularly suitable for irradiation in the short-wave UV region, since the photoactive sulfonium groups absorb below 300 nm (in the deep UV region). Suitable sources of radiation are excimer lasers (KrF: 248 nm) and Hg low pressure lamps ($\lambda = 257$ nm). However, it is also possible to sensitize the polymers with admixed sensitizers, for example polycyclic aromatics, such as perylene, so that irradiation with long wave UV light becomes possible.

Suitable developers for positive development are polar solvents, for example isopropanol, and alkaline solutions at above pH 11, for example aqueous solutions of alkali metal hydroxides, tetraalkylammonium hydroxides or amines.

Suitable developers for negative development are apolar organic solvents, for example dichloromethane/hexane mixtures, chlorobenzene or anisole.

The radiation-sensitive polymers according to the present invention are suitable for producing photoresists, in particular for producing resists for microlithography, and for use as circuit board resists. They are notable in particular for high sensitivity and high resolution combined with the ideal rectangular resist profile.

In the Examples, parts and percentages are by weight, unless otherwise stated.

The fabrication of semiconductor components using the radiation-sensitive polymers according to the present invention is effected in a conventional manner by means of the photolithography technique as described for example in Peter Kästner, Halbleitertechnologie, Vogel-Verlag Würzburg 1980, pages 75 to 117.

EXAMPLES OF MONOMER SYNTHESES

I. Monomers having acid-labile side groups:

p-t-Butoxycarbonyloxystyrene is prepared as described in U.S. Pat. No. 4,491,691.

p-Trimethylsilyloxystyrene is prepared as described in EP-A-178,208.

p-t-Butoxystyrene is prepared by Wittig reaction of p-t-butoxybenzaldehyde with methyltriphenylphosphonium bromide.

II. Monomers having sulfonium salts in the side group:

Sulfonium salt IIa is obtained by reacting dimethyl-4-hydroxyphenylsulfoniumhexafluoroarsenate with isocyanatoethyl methacrylate as per J. Polym. Sci., Polym. Chem. Ed. 18 (1980), 1021.

| Elemental analysis: | C | H | S | As |
|---|---|---|---|---|
| calculated: | 36.1 | 4.0 | 6.4 | 15.0 |
| found: | 34.8 | 4.1 | 6.8 | 15.7 |

The same method was also used to prepare the sulfonium salts with other counterions such as $SbF_6^{\ominus}$ and $PF_6^{\ominus}$.

Sulfonium salt IIb is prepared as described in J. Polym. Sci. Part C: Polym. Lett. 26 (1988), 79.

EXAMPLE 1

Polymerization 2 parts of the reaction product of dimethyl-4-hydroxyphenylsulfonium hexafluoroarsenate and isocyanatoethyl methacrylate are heated together with 3.5 parts of 4-t-butoxycarbonyloxystyrene, 0.066 part of azobisisobutyronitrile and 5 parts of toluene at 70° C. for 8 hours. The viscous solution is diluted with acetone, and the copolymer is precipitated in naphtha. The copolymer is redissolved and reprecipitated twice more, leaving 2.1 parts of copolymer. IR and NMR spectra show the presence of the two monomer components in the copolymer.

| | | | | | |
|---|---|---|---|---|---|
| Elemental analysis (%): | C 58.4 | H 6.4 | S 2.2 | As 5.5 | F 8.4 |
| Atomic ratio | 11 | 14 | 0.16 | 0.17 | 1.0 |

Lithography:

A photoresist solution is prepared from 20 parts of the synthesized polymer and 80 parts of methylpropylene glycol acetate and filtered through a filter of pore size 0.2 μm. The resist solution is spincoated onto a silicon wafer, producing a layer thickness of about 1 μm. Thereafter the wafer is baked at 90° C. for 1 minute and contact irradiated through a structured test mask with excimer laser light of wavelength 248 nm for 7 seconds. This is followed by a further bake at 80° C. for 60 seconds and development with a 20% strength aqueous solution of hydroxyethylpiperidine for 60 seconds. The result is a positive image of the mask. Scanning electron micrographs show highly resolved 1 μm resist structures with a sharp edge profile.

EXAMPLE 2

The photoresist solution of Example 1 is processed as described there, except that it is developed not with the alkaline developer but with pure anisole for 20 seconds. The result is a negative resist pattern.

EXAMPLE 3

2.0 parts of vinylbenzylsulfonium salt (IIb), prepared as described in J. Polym. Sci. Part C: Polymer Letters 26 (1988), 79, and 4.0 parts of 4-t-butoxycarbonyloxystyrene are dissolved in 6 parts of tetrahydrofuran, 0.07 part of azobisisobutyronitrile is added, and the mixture is heated at 70° C. for 8 hours. The copolymer is precipitated in naphtha. Lithographic tests as described in Examples 1 and 2 show that the polymer is photosensitive and developable both negatively and positively, giving resist structures of almost rectangular profile without bridge formation.

EXAMPLE 4

Example 3 is repeated except that the 4.0 parts of 4-t-butoxycarbonyloxystyrene are replaced by 8.0 parts of p-trimethylsilyloxystyrene.

EXAMPLE 5

2.0 parts of sulfonium salt (IIa) and 7.0 parts of p-tert-butoxystyrene are dissolved in 4 parts of toluene, and 0.07 part of azobisisobutyronitrile is added. The polymer is precipitated in naphtha and dried at 50° C. under reduced pressure. Lithographic tests as described in Examples 1 and 2 show that it is again possible to produce positive and negative resist patterns. Resolution is down to 1 μm resist structures. The structures have almost vertical flanks.

We claim:

1. A radiation-sensitive polymer, containing homogeneously distributed in one and the same molecule not only acid-labile groups but also onion salt groups with nonnucleophilic counterions.

2. A radiation-sensitive polymer as defined in claim 1, wherein the onion salt groups are sulfonium or iodonium salt groups.

3. A radiation-sensitive polymer as defined in claim 1, containing, copolymerized in one and the same molecule, units of the formulae (I) and (II) or (I) and (III)

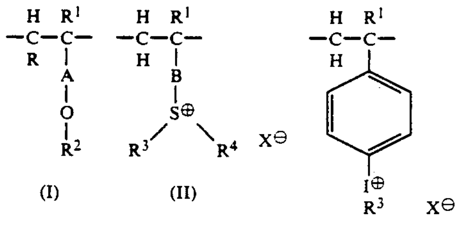

(I) (II) (III)

where A =

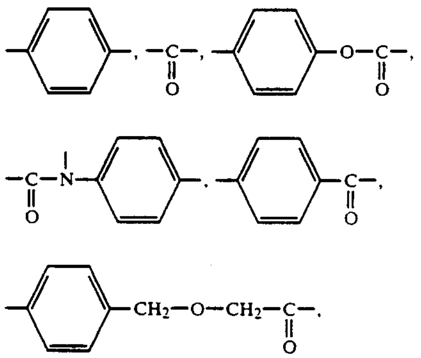

B is a divalent radical from the group consisting of alkylene,

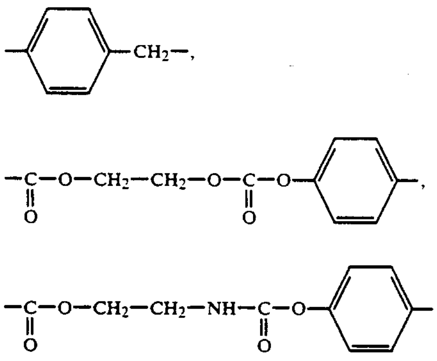

and phenylene,

R is H, alkyl, aryl, substituted aryl or if

A = 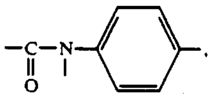, a 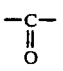

group bonded to this group A at the nitrogen atom, $R^1$ is H, alkyl, CN, halogen or trihalomethyl, $R^2$ is an acid-labile group, $R^3$ and $R^4$, which may be identical to or different from each other, are each alkyl, aryl or substituted aryl or together form a 5-, 6-, 7-, 8- or 9-membered ring, $X^{\ominus}$ is a nonnucleophilic counterion selected from the group consisting of $ClO_4^{\ominus}$, $CF_3SO_3^{\ominus}$, $BF_4^{\ominus}$, $AsF_6^{\ominus}$, $SbF_6^{\ominus}$ and $PF_6^{\ominus}$.

4. A radiation-sensitive polymer as defined in claim 2, containing, copolymerized in one and the same molecule, units of the formulae (I) and (II) or (I) and (III)

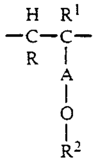

(I)

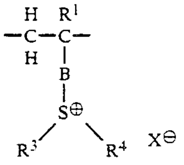

(II)

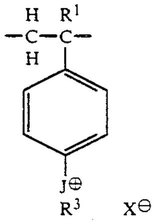

(III)

where A =

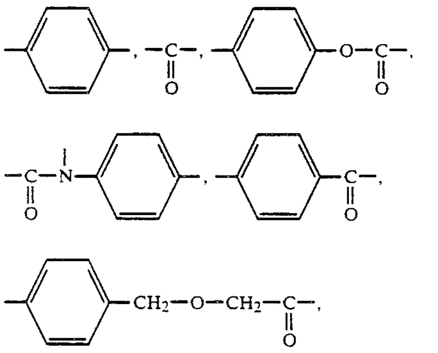

B is a divalent radical from the group consisting of alkylene,

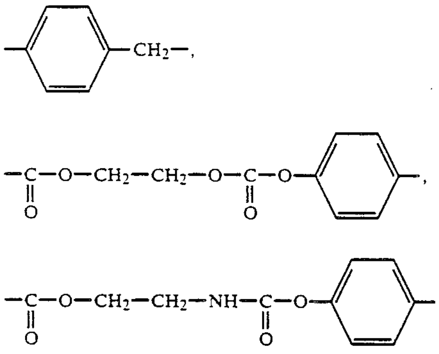

and phenylene,

R is H, alkyl, aryl, substituted aryl or if

A = 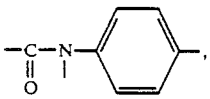, a 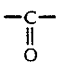

bonded to this group A at the nitrogen atom, $R^1$ is H, alkyl, CN, halogen or trihalomethyl, $R^2$ is an acid-labile group, $R^3$ and $R^4$, which may be identical to or different from each other, are each alkyl, aryl or substituted aryl or together form a 5-, 6-, 7-, 8- or 9-membered ring, $X^{\ominus}$ is a nonnucleophilic counterion selected from the group consisting of $ClO_4^{\ominus}$, $CF_3SO_3^{\ominus}$, $BF_4^{\ominus}$, $AsF_6^{\ominus}$, $SbF_6^{\ominus}$ and $PF_6^{\ominus}$.

5. A radiation-sensitive polymer as defined in claim 1, wherein the acid-labile groups are tert-alkyl, tert-alkoxycarbonyl, trialkylsilyl or tetrahydropyranyl groups.

6. A radiation-sensitive polymer as defined in claim 1, containing from 2 to 30 mol % of monomer units having sulfonium or iodonium salt groups as copolymerized units.

7. A radiation-sensitive polymer as defined in claim 3, consisting of polymerized units of the formulae

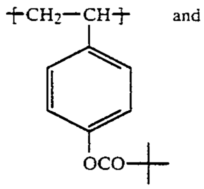

and

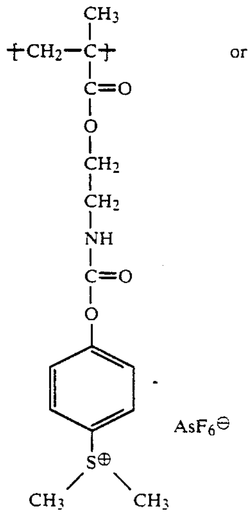

or

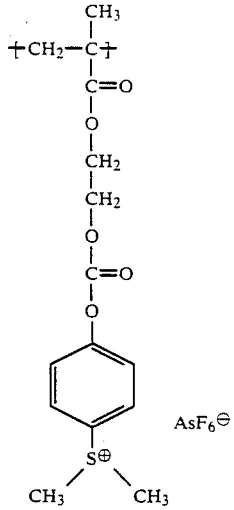

8. A radiation-sensitive polymer as defined in claim 3, consisting of polymerized units of formulae

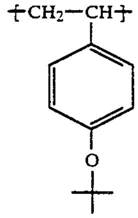

and

-continued
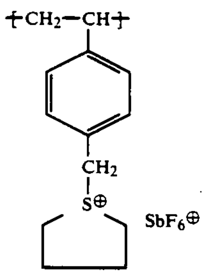
9. A radiation-sensitive polymer as defined in claim 3, consisting of polymerized units of formulae.
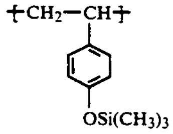
and
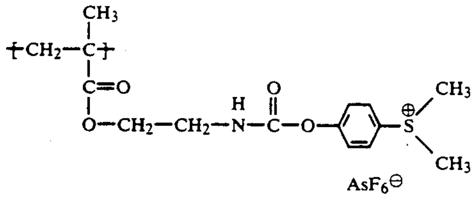
* * * * *

UNITED STATES PATENT AND TRADEMARK OFFICE

CERTIFICATE OF CORRECTION

PATENT NO. : 5,130,392

DATED : July 14, 1992

INVENTOR(S) : Reinhold SCHWALM et al.

It is certified that error appears in the above-identified patent and that said Letters Patent is hereby corrected as shown below:

Claim 1, column 11, line 60: "onion" should read "onium"

Claim 2, column 11, line 63: "onion should read "onium"

Claim 7, column 14; the first formula should read as shown

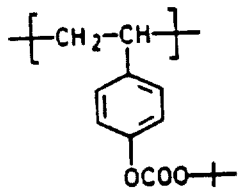

and

Signed and Sealed this

Seventeenth Day of August, 1993

Attest:

BRUCE LEHMAN

Attesting Officer

Commissioner of Patents and Trademarks